US009678136B2

(12) United States Patent
Spark et al.

(10) Patent No.: US 9,678,136 B2
(45) Date of Patent: Jun. 13, 2017

(54) BACK-PLANE CONNECTOR FOR CUBESAT

(71) Applicant: SPIRE GLOBAL, INC., San Francisco, CA (US)

(72) Inventors: Joel Spark, Calgary (CA); Jeroen Cappaert, Sint-Gillis-Waas (BE)

(73) Assignee: SPIRE GLOBAL, INC., San Francisco, CA (US)

( * ) Notice: Subject to any disclaimer, the term of this patent is extended or adjusted under 35 U.S.C. 154(b) by 131 days.

(21) Appl. No.: 14/514,836

(22) Filed: Oct. 15, 2014

(65) Prior Publication Data

US 2016/0109501 A1 Apr. 21, 2016

(51) Int. Cl.
| | |
|---|---|
| *G01R 31/04* | (2006.01) |
| *H05K 7/14* | (2006.01) |
| *H04N 5/225* | (2006.01) |
| *H04N 5/232* | (2006.01) |
| *H01Q 1/28* | (2006.01) |
| *H01Q 1/42* | (2006.01) |
| *H04N 5/77* | (2006.01) |

(52) U.S. Cl.
CPC ........... *G01R 31/041* (2013.01); *H01Q 1/288* (2013.01); *H01Q 1/42* (2013.01); *H04N 5/2252* (2013.01); *H04N 5/23241* (2013.01); *H05K 7/1434* (2013.01); *H05K 7/1438* (2013.01); *H04N 5/77* (2013.01)

(58) Field of Classification Search
CPC ............... G01R 31/041; H04N 5/2252; H04N 5/23241; H04N 5/76; H05K 7/023; H05K 7/026; H05K 7/06
USPC ........................................................ 348/374
See application file for complete search history.

(56) References Cited

U.S. PATENT DOCUMENTS

| | | | | |
|---|---|---|---|---|
| 6,023,291 A | * | 2/2000 | Kamel | G01C 11/025 348/116 |
| 6,356,966 B1 | * | 3/2002 | Loach | G06F 13/409 439/78 |
| 8,306,385 B2 | | 11/2012 | Hino et al. | |
| 8,478,571 B1 | * | 7/2013 | Murphy | G06F 17/5022 244/159.3 |
| 2001/0012716 A1 | * | 8/2001 | Corisis | H05K 3/301 439/357 |
| 2004/0008034 A1 | | 1/2004 | Mastoris et al. | |
| 2004/0226046 A1 | * | 11/2004 | Weng | H04N 5/76 725/105 |
| 2006/0282724 A1 | | 12/2006 | Roulo | |
| 2008/0086509 A1 | * | 4/2008 | Wallace | G06F 17/30598 |
| 2009/0087029 A1 | * | 4/2009 | Coleman | G06K 9/00208 382/103 |

(Continued)

OTHER PUBLICATIONS

International Search Report mailed on Feb. 24, 2016, issued in corresponding Application No. PCT/US2015/054889.

*Primary Examiner* — Lin Ye
*Assistant Examiner* — Chan Nguyen
(74) *Attorney, Agent, or Firm* — Troutman Sanders

(57) ABSTRACT

A back-plane connector connects component boards for a cubesat with a processing unit and a board connector electrically connected to the back-plane connector. The board connector mates with complimentary connectors on the component boards. The arrangement facilitates assembly, testing and operational reliability. An image capture system may be included and has an image capture device with a multiplexer for interactive collection and storage of image and video data.

5 Claims, 7 Drawing Sheets

(56) References Cited

U.S. PATENT DOCUMENTS

| | | | |
|---|---|---|---|
| 2011/0086520 A1* | 4/2011 | Mills | H01R 12/7011 |
| | | | 439/64 |
| 2011/0170797 A1 | 7/2011 | Johnson | |
| 2013/0235234 A1* | 9/2013 | Cucci | H04N 5/23206 |
| | | | 348/231.99 |
| 2014/0039729 A1 | 2/2014 | Puig-Suari, et al. | |
| 2014/0118256 A1* | 5/2014 | Sonoda | G06F 3/0346 |
| | | | 345/158 |
| 2014/0222472 A1* | 8/2014 | Platzer | G06Q 10/02 |
| | | | 705/5 |
| 2015/0146019 A1* | 5/2015 | Aoyama | H04N 1/00129 |
| | | | 348/207.1 |
| 2015/0199556 A1* | 7/2015 | Qian | G06K 9/0063 |
| | | | 382/215 |

* cited by examiner

BACK-PLANE CONNECTOR FOR CUBESAT

CROSS REFERENCE TO RELATED PATENT APPLICATIONS

This disclosure incorporates by reference the following pending U.S. patent applications: (1) Ser. No. 13/757,062, title: System And Method For Widespread Low Cost Orbital Satellite Access filed on Feb. 1, 2013; (2) Ser. No. 13/961,875, title: Computerized Nano-Satellite Platform For Large Ocean Vessel Tracking filed on Aug. 7, 2013; and (3) Ser. No. 13/961,384, title: System And Method For High-Resolution Radio Occultation Measurement Through The Atmosphere filed on Aug. 7, 2013. Further, this disclosure incorporates by references U.S. patent application Ser. No. 14/514,573 filed Oct. 15, 2014. All of the references are herein incorporated by reference.

FIELD OF INVENTION

The inventions herein are directed to novel systems and methods for supporting satellite design, manufacturing and operation. In particular, the present invention is directed to the manufacture of small form factor satellites (known in the art as "cubesats"), selected subsystems in satellite design and computer systems for managing and implementing operating protocols for satellites after deployment.

BACKGROUND

A growing interest in low earth orbit satellites having a small form factor has led to an increase in both launches of the vehicles and the recognition that earlier techniques for manufacturing and control thereof are inadequate. While standardized to some extent, significant variations in design have taken hold in this industry.

Due to their smaller size, cubesats generally cost less to build and deploy into orbit above the Earth. As a result, cubesats present opportunities for educational institutions, governments, and commercial entities to launch and deploy operable satellites for a variety of purposes with fewer costs compared to traditional, large satellites. When assembled, the core of a satellite is a collection of parallel computer boards that mount in stacked fashion within the rectangular cavity of the satellite shell or frame 10, as illustrated in FIG. 1. Connections between boards 30 traditionally have been accomplished by a connection bar 20 that was placed between each board 30 to bridge to the next board—above and below. As additional boards 30 are added to the stack, they are connected in series forming a stacked assembly of individual boards. Each board provides additional resources and/or functions to the satellite and the assembly is complete only when each of the boards 30 required for the operation of the satellite are properly positioned and fixed within the satellite frame 10.

In particular, during manufacturing, sub-assemblies are often constructed separately and then combined into the final product. A stack may involve three or more subassemblies each including one or more semiconductor chips (e.g., Application Specific Integrated Circuits—ASICs) for selective digital processing, memory and the like. Some subassemblies are boards with specialized components such as radios, sensors, camera elements, optics and associated controlling electronics. Before final assembly into the stack, each subassembly and/or board is individually tested. Once the full stack is assembled, the operation of the individual boards is again tested, and the entire stack is tested to insure operation within a design specification.

There were several difficulties encountered by this approach. To begin, if testing of the full assembly revealed a single board defect, the entire stack would necessarily require disassembly, a time consuming operation. In addition, assembly would often involve a selected order or arrangement of boards, determined by the individual functions of the selected boards. This removes flexibility and limits customization of the satellites which may impact their market value.

SUMMARY

A novel satellite design and assembly technique of the present invention employs a back-plane connector plate attached to the supporting frame of the satellite. The back-plane connector functions similarly to a PC motherboard supporting multiple connections to the boards forming the stack but shaped and configured for minimal weight and optimal performance. A universal connector terminal is provided allowing in some instances, for random stacking order for each board. Individual boards can be removed from the stack without disturbing the other boards in the assembly.

In accordance with various inventive features and examples, the board is sized and dimensioned to facilitate assembly and durability in service. Each board is approximately 97 mm square and is sized to fit inside the frame and provide the requisite surface area to support components on the board. These components are mostly integrated chips ("ICs") that have low shielding requirements. For the communication board, the associated radio includes its own shielding. Typically, the boards are constructed of fiberglass (for example, FR4 copperclad laminates).

In one embodiment, indented slots on each of the rectangular shaped boards provide for connective cable runs flush with the board perimeter and for the use of binding straps without interference.

During the assembly stage, individual component boards are tested for performance. Once these boards pass the initial testing sequence, they are individually placed into their respective slots on the satellite frame. After the last board is inserted, the assembly is placed into a test rig, connected to a testing module and further tested collectively. In particular, a series of electronic signals are applied to and collected from the assembled satellite. If one or more of the assembled boards fails this testing protocol, it is simply removed from the stack by disconnecting it from the backplane connector plate. A replacement board is then inserted and the process of testing the assembly restarted.

In addition to the IC boards discussed above, a separate image component board is provided that permits imaging using a sensor array constructed in accord with established video standards, for example, supporting the GoPro® line of image capture equipment.

BRIEF DESCRIPTION OF THE DRAWINGS

The drawing figures depict one or more implementations in accord with the present teachings, by way of example only, not by way of limitation. In the figures, like reference numerals refer to the same or similar elements.

DETAILED DESCRIPTION

Figure 1:
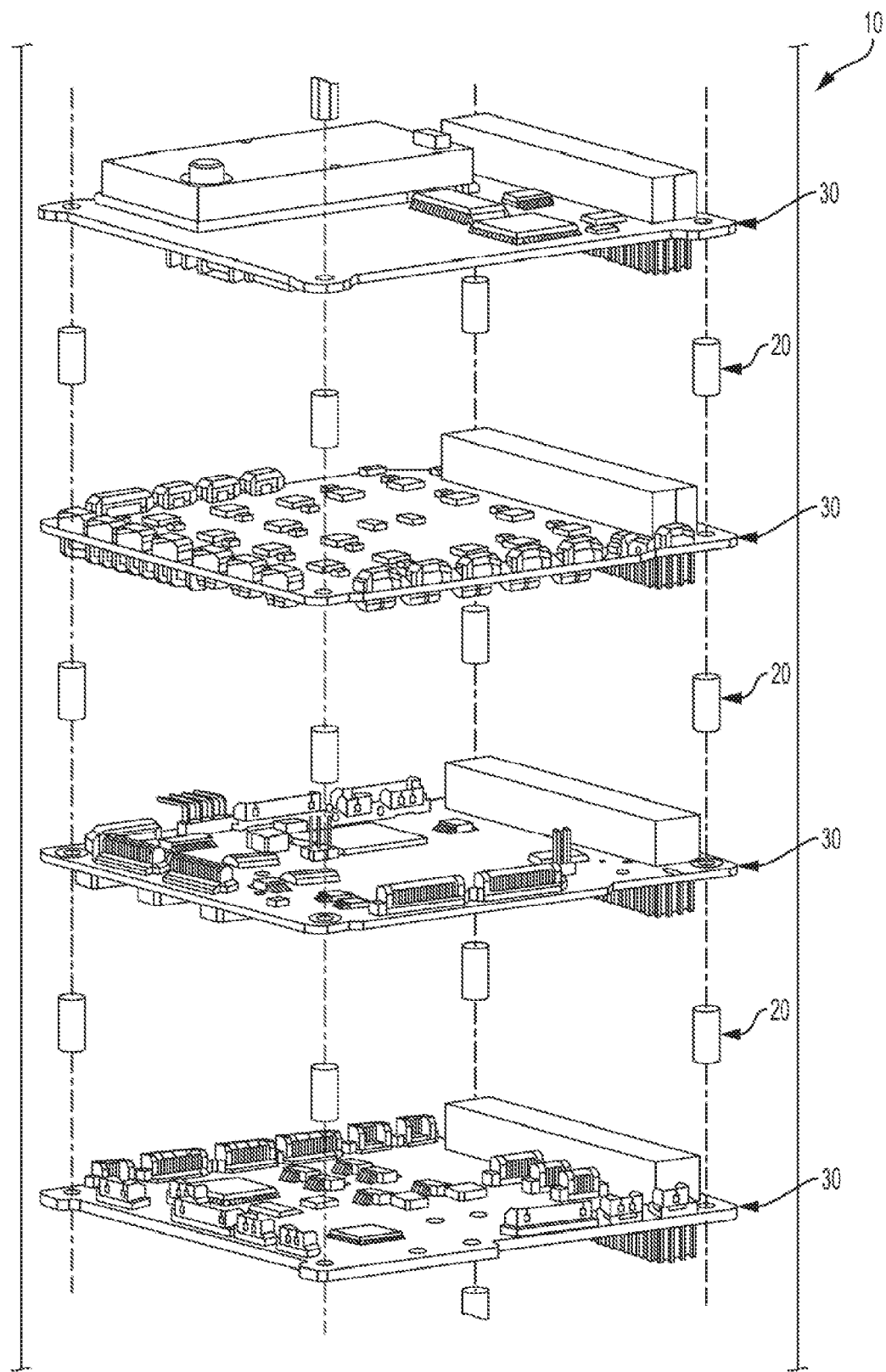
FIG. 1 is a side isometric assembly view depicting prior art computer boards placed into a satellite frame.
Figure 2:
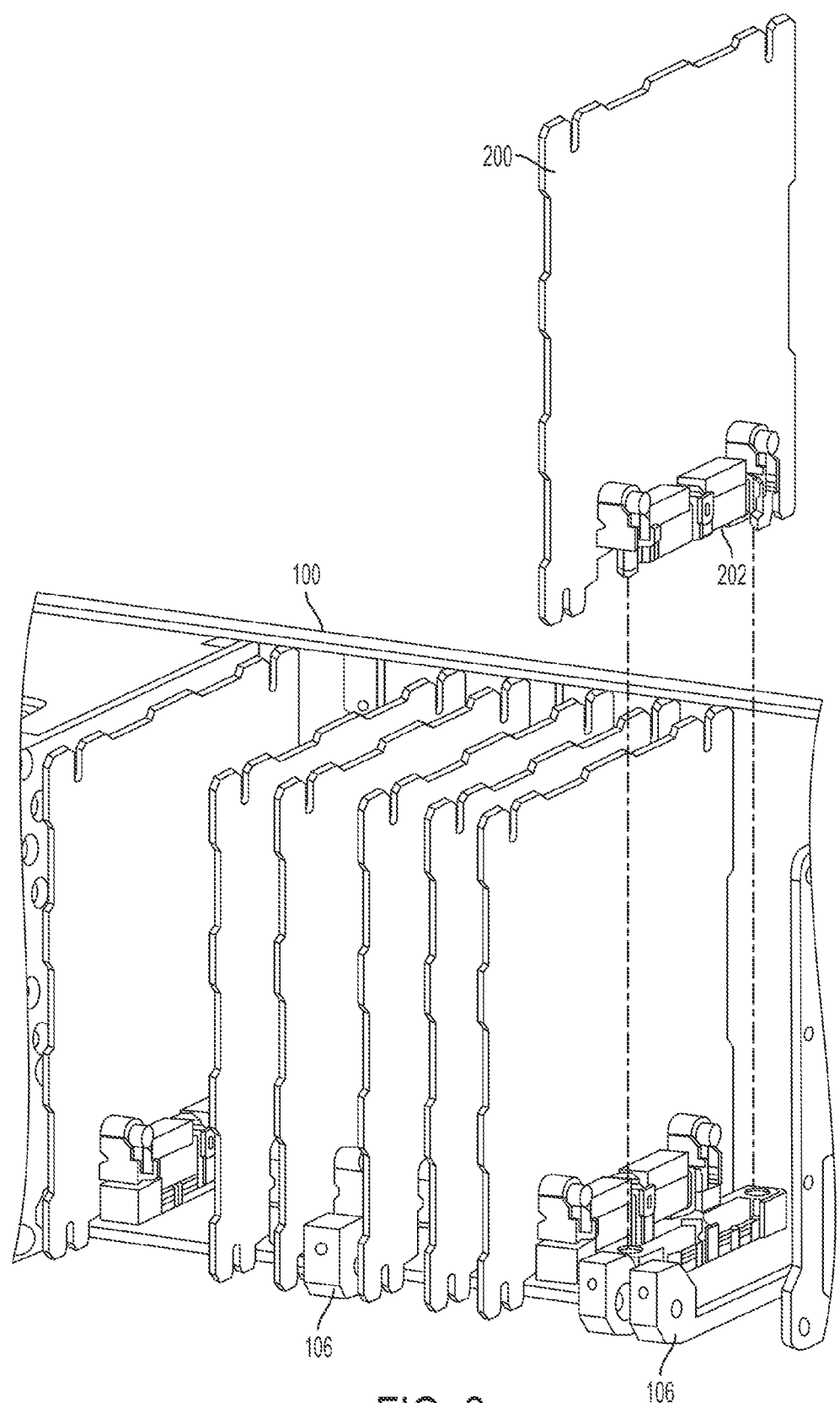
FIG. 2 is a front side isometric view of assembled boards placed into a satellite frame using a direct connection pin-out design.
Figure 3:
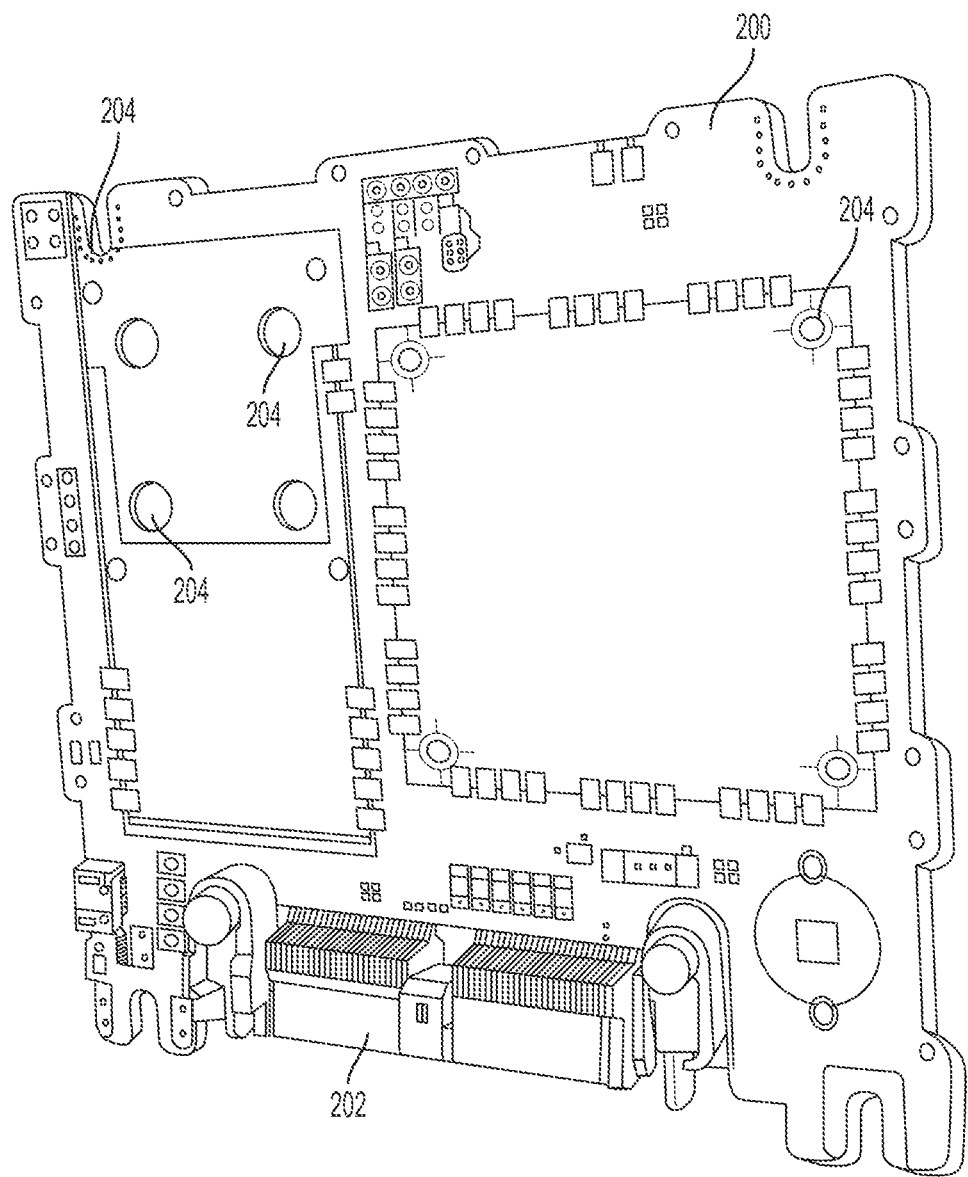
FIG. 3 is a top view of an example of a component board of the present invention.
Figure 4:
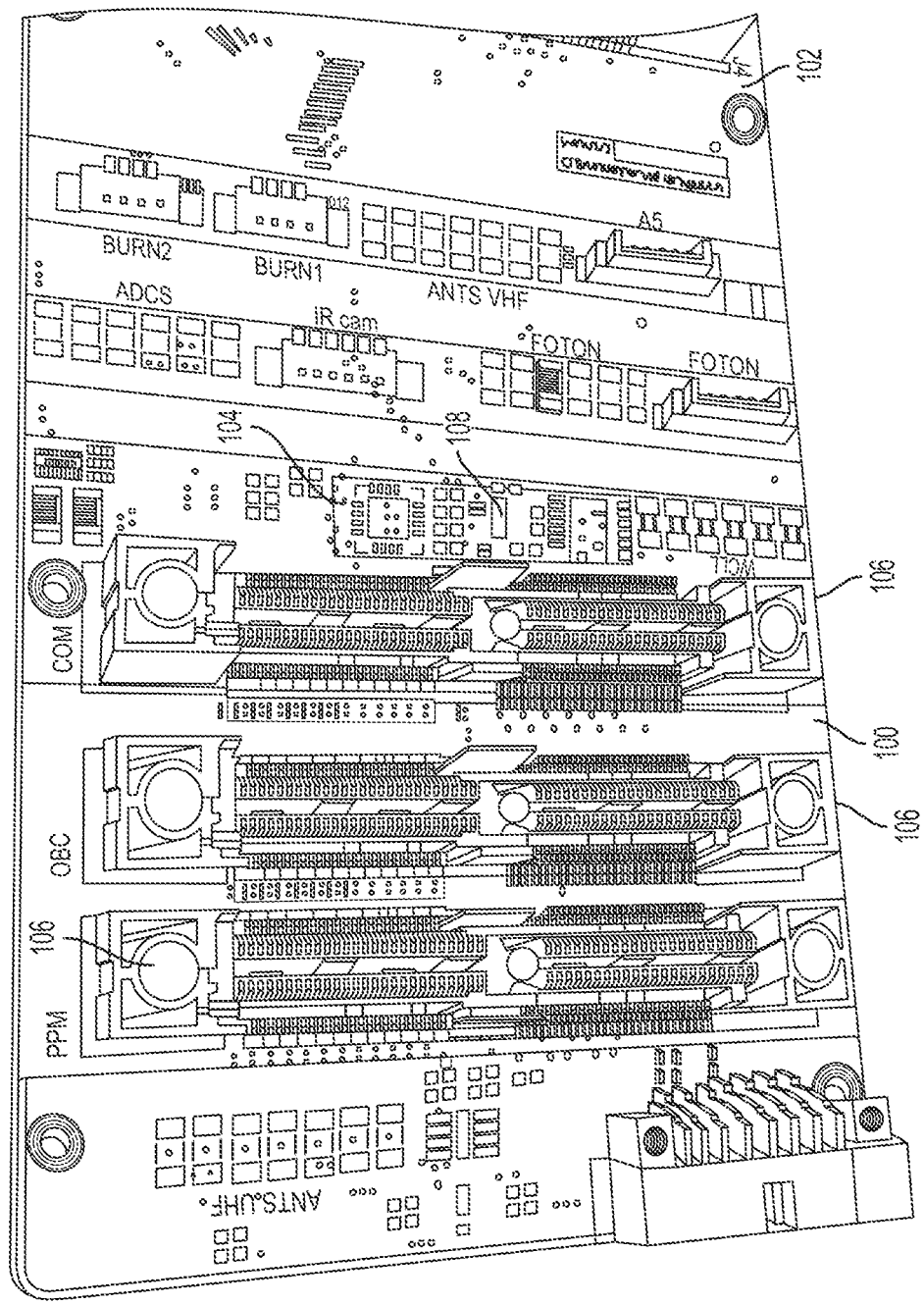
FIG. 4 is a top view of an illustrative back-plane connector of the present invention.
Figure 5:
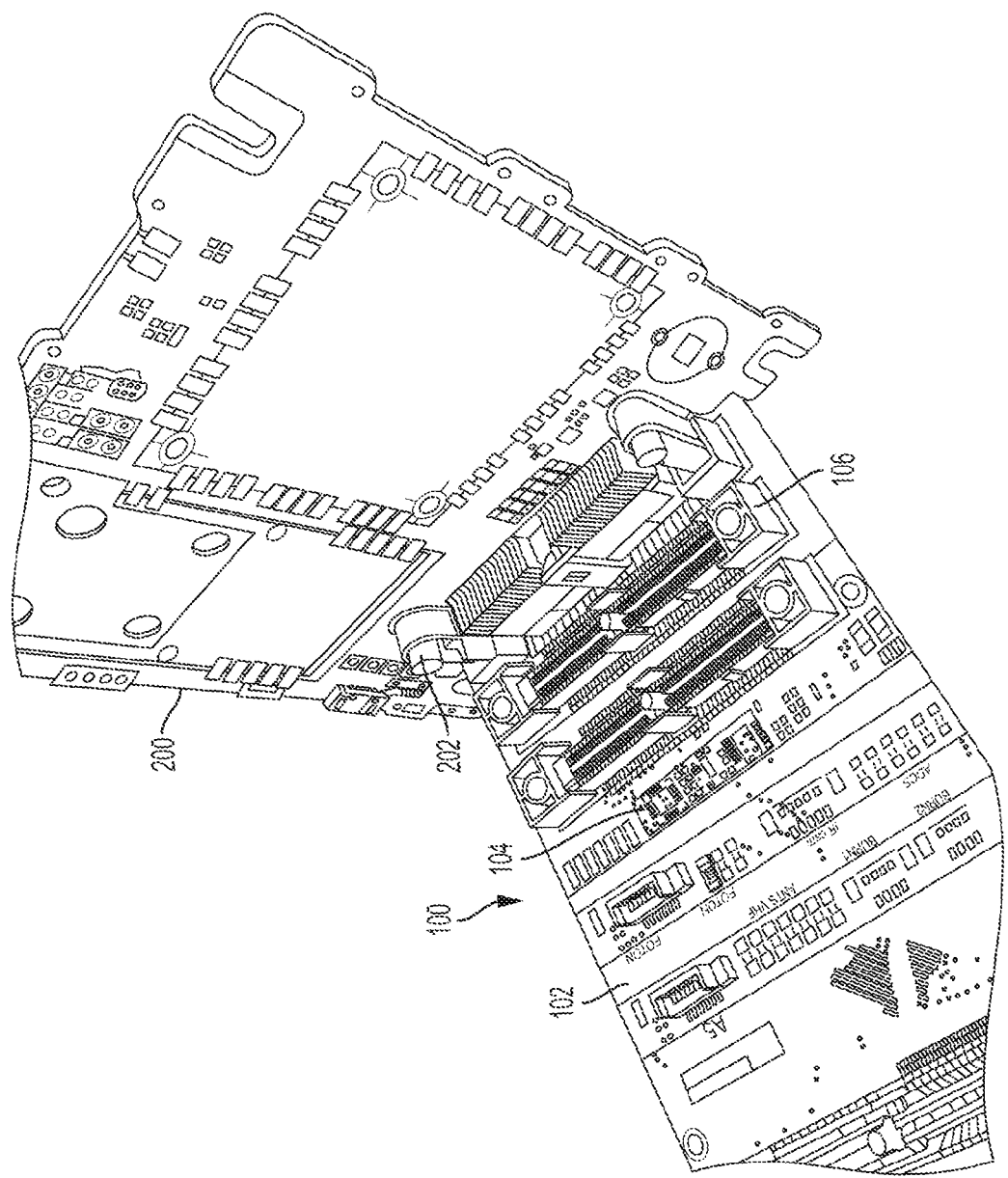
FIG. 5 is a side view of an example of the component board mounted in the back-plane connector.

In the following detailed description, numerous specific details are set forth by way of examples in order to provide a thorough understanding of the relevant operations. However, it should be apparent to those skilled in the art that the present invention can be implemented in a manner that will embrace one or more of these examples and other related arrangements. Additional, well known methods, procedures, components, and/or circuitry have been described at a relatively high-level, without detail, in order to avoid unnecessarily obscuring aspects of the present teachings.

Certain challenges are presented when designing cubesats such as incorporating the desired structure and electronics into a relatively small form factor, maximizing the efficiency of the included components given volume and mass constraints, and providing sufficient communication systems to relay information to and from networked satellites within the constellation and ground-based systems. Imaging cubesats, for example, utilize much of the volume of the satellite for the imaging system.

The back-plane connector 100 facilitates system assembly and inter-board communication. The back-plane connector 100 is, in one embodiment, the center "hub" for all components in the cubesat. A radio antenna, power source, memory, processor, etc. can be linked to and communicate through the back-plane 100.

The back-plane connector 100 includes controller intelligence embedded into local processors on the board 102. The intelligence can come in the form of a processing unit 104, (e.g., a CPU, MCU, or ASIC). This allows the back-plane connector 100 to include some self diagnostic features, as discussed below.

Another feature of the back-plane connector 100 is a board connector 106 that can accept a component board 200. The component board 200 can have a complimentary connector 202 that electrically connects to the board connector 106.

The component board 200 is sized and dimensioned, in one example, to facilitate assembly and durability in service. Each board is approximately 97 mm square and is sized to fit inside the frame and provide the requisite surface area to support components on the board 200. Typically, the boards 200 are constructed of fiberglass (for example, FR4 copperclad laminates).

The connectors 106/202 allow for the exchange of electrical power, data, etc. between the board 102 and the component board 200. The component board 200 includes apertures 204, within and around a perimeter of the board, designed to allow cables to pass therebetween. Given the small size of the cubesat, the apertures 204 permits wires to run through the component boards 200 to optimize space and weight. In addition, the apertures 204 can be used to keep wires grouped or separated, saving weight from additional ties or separators. In an example, a number of apertures 204 aligned from multiple component boards 200 can act as a cable or wire raceway inside the cubesat.

Further, the connectors 106/202 can allow for independent and stable mounting of one or more component boards 200. Allowing the component boards 200 to be individually mounted and, in one example, not secured to each other, allows the rapid mounting, testing, and replacement cycle to streamline cubesat assembly. The back-plane connector 100 can reduce the full assembly time for a cubesat by anywhere from half to one or more orders of magnitude. For example, assembly time can drop from 3 hours, to 15 minutes, by using the back-plane 100.

Turning back to the self diagnostic features, the back-plane connector 100 can have pulsing LEDs (light emitting diodes) 108 that can act as a "heartbeat" for the cubesat. The LEDs 108 can start or stop pulsing, pulse at different frequencies, or change color to show the status of the back-plane connector 100 and component board 200 attached thereto. During assembly and testing, the LEDs 108 can inform the user whether component board 200 is in its proper location or functioning normally. Embedded intelligence samples the board during the diagnostics and controls LED output based on the information from the sample.

The back-plane 100 connector can also have a default mode. In typical use, the power supply and power switching to the back-plane connector 100 can be constant to maintain voltage to the board 102, and thus, the connector boards 200. If the processing unit 104 detects a power switch failure, the unit 104 can change the power state of the entire back-plane connector 100 into a default mode. Default mode switches from a continuous power supply to a limited power state. The default state can reduce power levels to the board 102, and thus the component boards 200, to place the majority of the function off-line. However, the default mode can supply enough power to run some simple diagnostics. Another example of a default mode is to avoid simultaneously powering certain component boards 200 and performing a radio transmission. This prevents overlapping power usage and reduces the total power load.

The embedded intelligence for the back-plane connector 100 may use firmware, software, or hardwired directly into the circuitry, depending on the complexity and need for updates.

Figure 6:
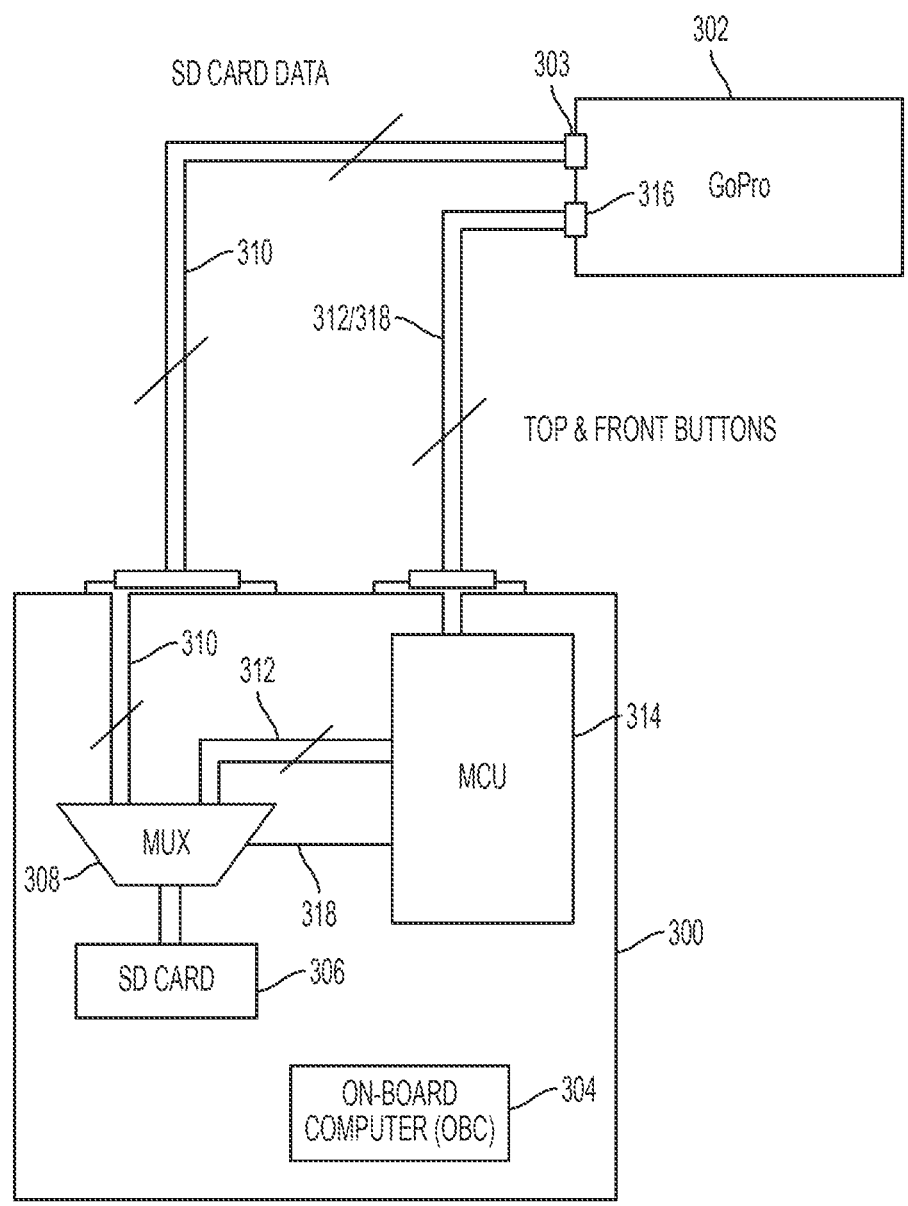
FIG. 6 is a block diagram of an example image component board that can interface with image capture devices.
Figure 7A:
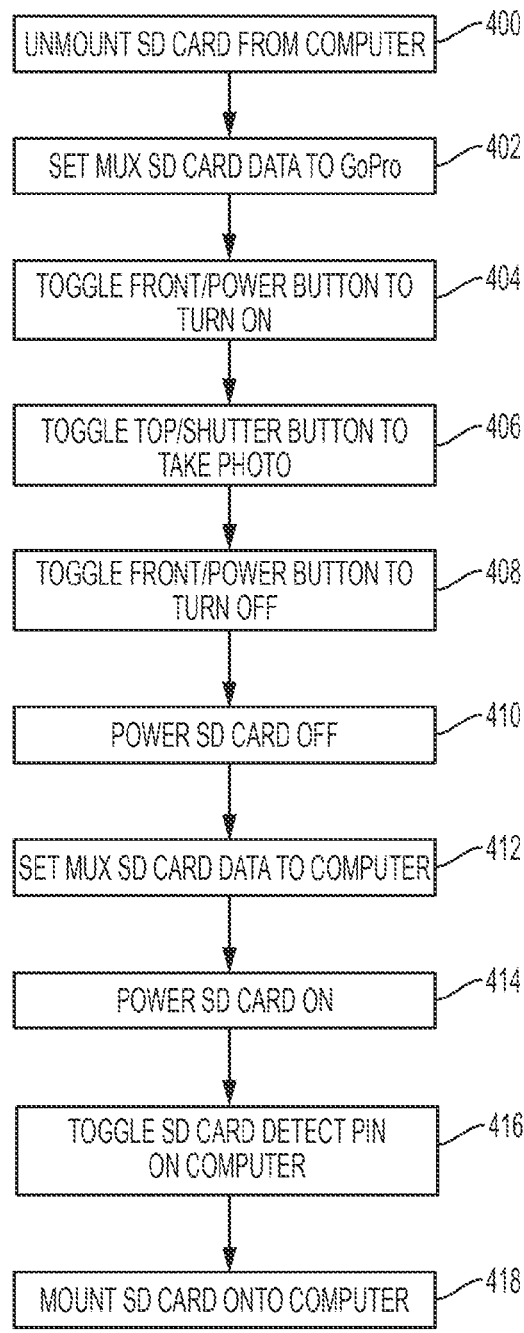
FIGS. 7A and 7B are flow diagrams depicting methods for capturing images from the interfaced image capture device.
Figure 7B:
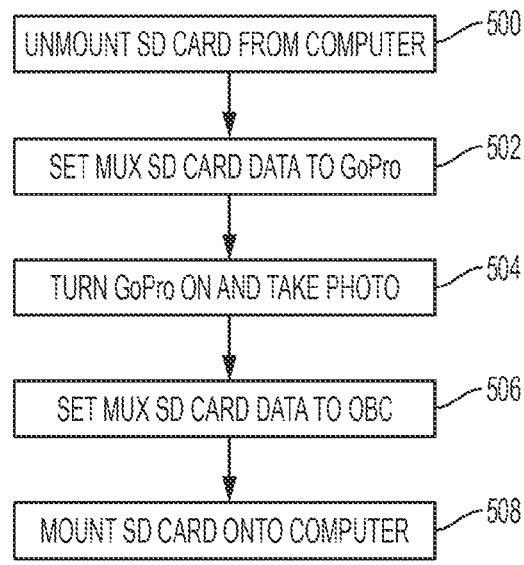

Turning now to FIGS. 6 and 7A & 7B, they illustrate an example of a type of component board 300. This image component board 300 can interface with an image capture device 302. Examples of image capture devices can be one or more of a GoPro® line of cameras. GoPro® cameras are designed for rugged environments and are capable of capturing both still and video images. Further, the GoPro® cameras (e.g. Hero3+™) have a scripting language to send advanced programming to and return information from the camera.

Image capture devices 302 often include a memory card slot (memory device receiver 303) to receive a removable memory unit (not illustrated), for example an SD (secure digital) Card, to store the captured images. An image capture devices 302 that cannot output images directly, say, over a wired interface, must rely on the removable card for image storage. That memory then needs to be removed from the image capture device 302 and inputted into a separate device (like a computer, laptop, tablet, card reader, enabled printer, etc) for the image data to be retrieved or viewed. The physical removal and reinsertion of a memory card into the memory device receiver 303 of the image capture device 302 while mounted to a cubesat in orbit is not practicable.

FIG. 6 illustrates an example of a preferred method for storing image data using a "GoPro." The image component board 300 is configured to appear as both memory and an on-board computer to the image capture device 302. The component board 300 can include an On-Board Computer ("OBC") 304, which can be a Reduced Instruction Set Computer ("RISC"). The RISC 304 is a type of microprocessor architecture that utilizes a small, highly-optimized set of instructions. The board 300 can also include a memory device 306 which emulates or, in one example, an actual SD Card for the image capture device 302 to store images. The memory device 306 interfaces with a multiplexer ("MUX") 308. The MUX 308 selects one of two (or more) connection paths between the image capture device and either memory or the board processor. The MUX 308 establishes communication first between the image capture device 302 and memory 306; and then switches communication from the memory 306 to the image processor/controller 314.

In the present example the MUX 308 links the image data output 310 from the image capture device 302 to the memory device 306. In this way, the memory device 306 appears as an installed memory card in the memory device receiver 303 on the image capture device. Camera controlling script files located on memory 306 are thus read by the image capture device and implemented therein. The image capture device 302 is "unaware" that the card is not physically installed in the memory device receiver 303. In essence, in this arrangement, the memory 306 emulates a memory card and appears as such for the camera.

Once captured, MCU 314 reads out the image data from memory 306 by a second connection through the MUX 308. The MCU processes the data locally or transmits this image data to other boards via backplane 100 to allow for on-board processing; and ultimately sending the image or processed data to one or more ground stations. In one embodiment, the computer controlled MUX 308/memory device 306 combination becomes the electronic equivalent to recording on then removing an SD card from a camera and placing it into a computer.

The MCU 314 optionally directly controls selected functions of image capture device 302. The input 316 include the actual buttons on the image capture device 302 or the commands associated with such buttons within the image capture device 302 to perform distinct tasks, for example: power on/off, capture an image, start/stop/pause a video recording, change the image parameters (e.g., focus, zoom, wide angle, f-stop, brightness, image/video resolution, field of view, aspect ratio, white balance, color, ISO, frame rate, sharpness, etc.), time lapse/and or intervals between images, etc. The MCU 314 commands operate in lieu of the "hands" typically used to manipulate the camera.

In one arrangement, MCU 314 is linked 312, 318 to the MUX 308 and the memory unit 306 to transmit script files received by the cubesat to memory unit 306 to control image capture device 302 as noted above. The link 318 allows communications with the MCU 314, including status information. Link output 312 retrieves images and other data stored on memory 306 through MUX 308.

The above example can be used with any type of image capturing device to create a "dummy SD card" and then switch the SD card between connecting with the image capture device 302. The program data (e.g. scripts) on the SD card instruct the image capture device 302 to turn on, take pictures or video at select intervals, collect the image data and store it back on memory 306.

FIGS. 7A and 7B illustrate different examples of a method of the image capture board 300 interfacing with the image capture device 302. FIG. 7A is a "full" sequence including computer activated imaging, starting with "unmounting" the memory device 306 from the OBC 304 (step 400). The terms "mounting" and "unmounting" in these examples are not a physical act, but electronically switching between two states, selecting the device that is in communication or linking with the memory device 306. The MUX 308 is then set to link the image capture device 302 (step 402) so that the device 302 treats the memory device 306 as if it is internally mounted. The MCU 314 then provides instructions to power on the image capture device 302 (step 404) capture an image (step 406) and then power off the device 302 (step 408). The memory device 306 is also powered off (step 410) so it can be "removed" from the image capture device 302. The MUX 308 links memory device 306 to the MCU 314 (step 412) and the memory device can be powered back on (step 414). The MCU detects the memory device 306 (step 416) and then the memory device 306 can be "mounted" (step 418) to allow the image data to be transmitted from the memory device 306 for local analysis or for transmission to a remote receiver.

FIG. 7B illustrates an example of the scripting method controlling for the image capture board 300 interfacing with the image capture device 302. The memory device 306 is first "unmounted" from the computer (step 500). The MUX 308 then connects the image capture device 302 to the memory card 306 (step 502). The image capture device is activated, instructions loaded and image and/or video recorded (step 504). The MUX 308 is then set to link the image data on the memory device 306 to the OBC 304 (step 506) and the memory device 306 is "mounted" to the OBC 304 (step 508) to allow the image data to be transmitted from the memory device 306 to the OBC 304.

While the foregoing has described what are considered to be the best mode and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

What is claim is:

1. A cubesat configured for orbital imaging, comprising:
an image capture device; and
a board disposed in a satellite frame of the cubesat, the board including:
a processor;
a memory device having two states, including a first state in which the memory device forms data communication with the image capture device for recording an image captured by the image capture device in the memory device, and a second state in which the memory device forms data communication with the processor for outputting the recorded image to the processor; and
a multiplexer for transitioning the memory device between the two states in a manner such that:
the multiplexer establishes a first connection between the image capture device and the memory device;
the processor outputs an instruction to power on the image capture device and capture image data the memory device receives the captured image data from the image capture device in the first state via the first connection;

the processor outputs an instruction to power off the image capture device after the image data is captured;

the memory device is powered off after the processor outputs the instruction to power off the image capture device;

the multiplexer establishes a second connection between the memory device and the processor;

the memory device is powered on before the memory device outputs the image data to the processor via the second connection;

the processor detects the memory device before the memory device outputs the image data to the processor via the second connection; and the memory device outputs the image data to the processor in the second state via the second connection after the processor detects the memory device.

2. The system of claim 1, wherein image capture control instructions are stored in said memory and retrieved by said image capture device for implementation.

3. The system of claim 1, wherein the processor is in communication with said image capture device to transmit instructions regarding camera settings to implement video and image data collection.

4. The system of claim 1, wherein the memory device receives image data from the image capture device and said processor retrieves said image data for transmission to one or more remote receivers.

5. A method of capturing image data from an image capture device located on a cubesat in orbit, comprising the steps of:

establishing a first connection, by a multiplexer, between a memory device and the image capture device, the memory device disposed on a board positioned in a satellite frame of the cubesat;

outputting, by a processor of the board, an instruction to power on the image capture device and capture image data;

receiving, by the memory device, the captured image data from the image capture device, via the first connection;

outputting, by the processor of the board, an instruction to power off the image capture device after the image data is captured;

powering off the memory device after the processor outputs the instruction to power off the image capture device;

establishing, by the multiplexer, a second connection between the memory device and the processor;

powering on the memory device before the memory device outputs the image data to the processor via the second connection;

detecting the memory device by the processor before the memory device outputs the image data to the processor via the second connection; and outputting the image data by the memory device to the processor via the second connection after the processor detects the memory device.

* * * * *